United States Patent [19]

Sato

[11] Patent Number: 5,546,245
[45] Date of Patent: Aug. 13, 1996

[54] DATA STORAGE APPARATUS WITH AN A/D CONVERTER HAVING A REFERENCE VOLTAGE CONTROL BASED UPON A SIGNAL BEFORE AND AFTER DISCRIMINATION

[75] Inventor: Naoki Sato, Kokubunji, Japan

[73] Assignee: Hitachi, Ltd, Tokyo, Japan

[21] Appl. No.: 74,297

[22] Filed: Jun. 9, 1993

[30] Foreign Application Priority Data

Jun. 9, 1992 [JP] Japan .................................. 4-149255

[51] Int. Cl.$^6$ .............................. G11B 5/035; H03M 1/62; H03M 1/84; H03M 1/88
[52] U.S. Cl. ................................ 360/65; 341/139
[58] Field of Search ...................... 360/65, 45, 46, 360/32; 341/132, 139, 155, 158, 157, 118; 369/32; 375/106

[56] References Cited

U.S. PATENT DOCUMENTS

| | | | |
|---|---|---|---|
| 4,393,371 | 7/1983 | Smith ................................ | 360/32 X |
| 4,549,165 | 10/1985 | Brian ................................. | 341/118 |
| 4,633,331 | 12/1986 | McGrady et al. ................. | 360/32 X |
| 4,912,572 | 3/1990 | Nomura et al. ................... | 360/46 |
| 4,972,190 | 11/1990 | Primeau et al. .................. | 360/32 X |
| 5,060,088 | 10/1991 | Dolivo et al. .................... | 360/46 |
| 5,194,865 | 3/1993 | Mason et al. ..................... | 341/132 |
| 5,206,647 | 4/1993 | Stone ................................. | 341/139 |
| 5,220,466 | 6/1993 | Coker et al. ...................... | 360/46 |
| 5,233,482 | 8/1993 | Galbraith et al. ................ | 360/32 X |
| 5,249,169 | 9/1993 | Ogawa .............................. | 360/32 X |

FOREIGN PATENT DOCUMENTS 59-143420  8/1984  Japan .

*Primary Examiner*—Donald Hajec
*Assistant Examiner*—Patrick Wamsley
*Attorney, Agent, or Firm*—Evenson, McKeown, Edwards & Lenahan

[57] ABSTRACT

A data storage apparatus and method that allows the signal processing circuit to be in integrated form, so that the magnetic storage system may be reduced in size with increased performance is described. The apparatus includes a reproducing head that reproduces information stored on a recording medium, a preamplifier that amplifies the output of the reproducing head, and a low-pass filter. An A/D converter converts the output for the low-pass filter to a digital signal and has a reference voltage. A discriminator is coupled to an output of the A/D converter and discriminates the digital signal. A circuit, coupled to the discriminator, provides negative feedback control of the reference voltage of the A/D converter as a function of the digital signal before the discrimination by the discriminator and the digital signal that has been discriminated by the discriminator.

16 Claims, 7 Drawing Sheets

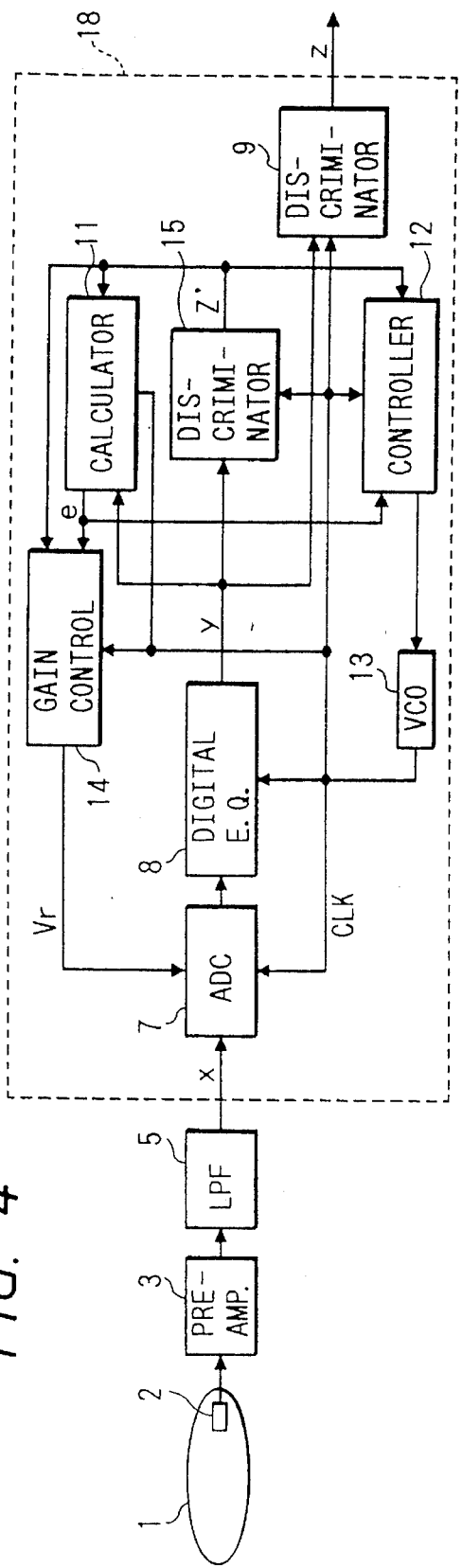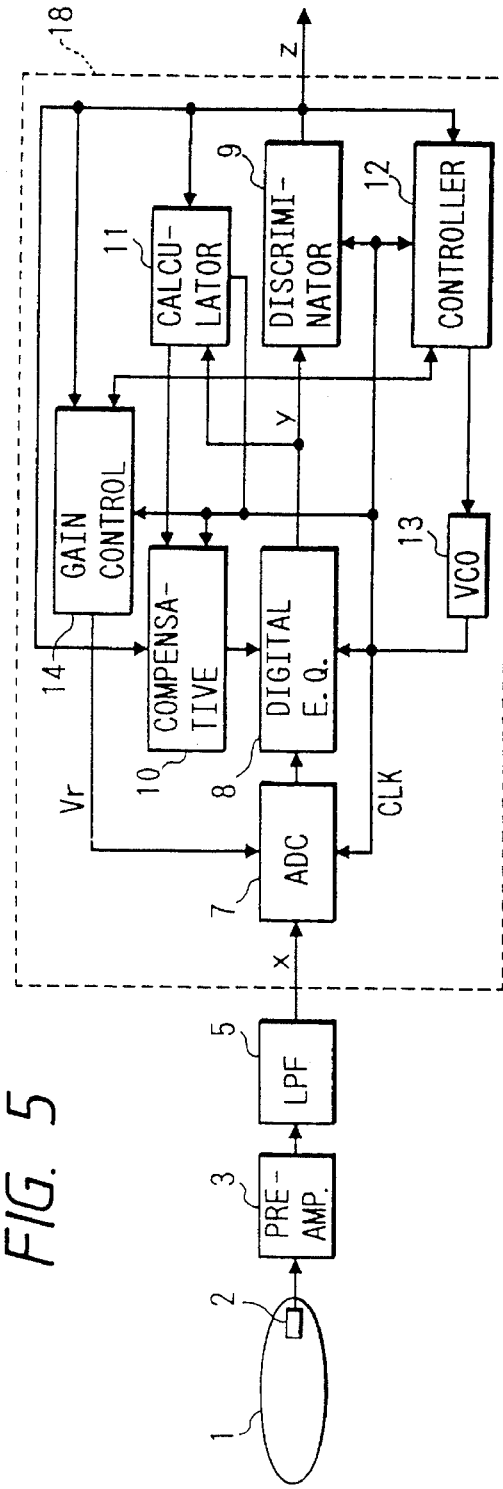

DATA STORAGE APPARATUS WITH AN A/D CONVERTER HAVING A REFERENCE VOLTAGE CONTROL BASED UPON A SIGNAL BEFORE AND AFTER DISCRIMINATION

BACKGROUND OF THE INVENTION

The present invention relates to a magnetic storage system, and more particularly to a signal processing circuit employing a novel analog to digital (A/D) conversion system that is preferably used for a signal processing circuit that uses digital signals of a magnetic storage system and to a magnetic storage system using the same circuit.

Studies have been made for employing partial response (PR) signal transmission technology in the field of communications as a read/write system for magnetic storage systems such as magnetic disk units. According to this technology, the recording signals are recorded while compressing the band of the recording signals, and during the reproduction, the waveforms inclusive of read/write characteristics are equalized, and the signals of a narrow band are reproduced on multiple levels.

The PR waveforms can be processed through a simply constituted circuit when the processing is carried out in the stage succeeding the equalizer. Here, however, the equalizer requires Nyquist equalization, leaving such problems as retarded convergence and increased equalization error. On the other hand, when the PR waveform processing is carried out in the stage preceding the equalizer by a method disclosed in, for example, U.S. Pat. No. 5,060,088, the automatic equalizer has a lessened load and the equalization is improved in regard to convergence and error.

FIG. 11 of the present application shows a conventional signal processing circuit for the case when the PR waveform processing is carried out in the stage preceding the equalizer. As shown in FIG. 11, the equalization that corresponds to the PR waveform processing is carried out by an analog fixed equalizer 6 in the stage preceding the automatic equalizer. A change in the characteristics of a read/write system caused by track position and the like of a magnetic disk 1 is adjusted for its gain through an automatic gain control circuit (AGC circuit) 4 and is digitized through an A/D converter 7. Then, by using known data recorded in advance on the magnetic disk 1, the characteristics of a digital equalizer are absorbed by automatic equalization characteristics of a compensative circuit 10. The change in the characteristics is then discriminated by a Viterbi decoder (discriminator) 9 in the succeeding stage. The automatic equalization system described above allows error due to the characteristics of the signal processing circuit to a great degree, but offers an increased degree of freedom for circuit design and reduces the cost of the storage system However, in the above prior art, the analog fixed equalizer 6 that performs the PR waveform processing requires complex processing of characteristics including slimming of waveforms, notching at a predetermined frequency and removal noise. For this purpose, therefore, such circuit components are required as an operational amplifier, a capacitor of a large capacity, an inductance, and the like. Moreover, an AGC circuit 4 composed of analog bipolar transistors is employed to output a suitable digital signal from an A/D converter in a stage that precedes the digital equalizer 8, in order to adjust the amplitude which is necessary for the digitization. These analog circuits and the outputting elements must be formed in an integrated manner involving great difficulty. In addition, an increase in the consumption of electric power and in the mounting area is not avoidable.

SUMMARY OF THE INVENTION

An object of the present invention is to provide a signal processing circuit in a circuit for processing PR waveforms and for processing reproduced signals in a magnetic storage system, the signal processing circuit employing a simplified analog circuit without using a conventional AGC circuit. The signal processing circuit should be highly densely fabricated, and consume less electric power, as well as provide a magnetic recording/reproducing circuit using the same circuit. By realizing the signal processing circuit in an integrated form, a magnetic storage system is provided which is smaller in size and superior in performance.

These and other objects are achieved by the present invention which provides a data storage apparatus comprising a reproducing head that reproduces information stored on a recording medium, a preamplifier coupled to an output of the reproducing head that amplifies the output of the reproducing head, a low-pass filter coupled to the preamplifier and having an output, an A/D converter that converts the output of the low-pass filter to a digital signal and has a reference voltage, a discriminator coupled to an output of the A/D converter that discriminates the digital signal, and a circuit, coupled to the discriminator, which controls by negative feedback the reference voltage of the A/D converter as a function of the digital signal before discrimination by the discriminator and the digital signal that has been discriminated by the discriminator.

In certain embodiments, the invention further comprises a digital equalizer coupled to an output of the A/D converter that equalizes the digital signal from the A/D converter and is connected with the discriminator, a calculator of equalization error coupled to an output of the digital equalizer and an output of the discriminator which subtracts a result of discrimination from the output of the digital equalizer to output an equalization error, a gain-controlled signal generator connected with an output of the calculator and the output of the discriminator which is operated by the equalization error and the output of the discriminator, and the circuit for negative feedback controls the reference voltage of the A/D converter based on an output of the gain-controlled signal generator.

In certain embodiments of the invention, the data storage apparatus includes a voltage-controlled oscillator which generates system clocks coupled with the A/D convertor, the discriminator, the digital equalizer, the calculator, and the gain controlled signal generator; a controller of the voltage-controlled oscillator coupled with the voltage-controlled oscillator, the digital equalizer, and the discriminator, which operates the voltage-controlled oscillator based on the equalization error and on the result of discrimination.

According to the present invention, a signal from a magnetic head is passed through a simply constructed low-pass circuit (LPF:low-pass filter) and is directly digitized through an A/D converter without using a conventional AGC circuit. After the A/D conversion, the signals that are processed are all digital signals.

BRIEF DESCRIPTION OF THE DRAWINGS

FIG. 4 is a circuit diagram illustrating a signal processing circuit according to another embodiment of the present invention.

FIG. 5 is a circuit diagram illustrating a further embodiment of the present invention.

DETAILED DESCRIPTION OF THE DRAWINGS

Figure 1:
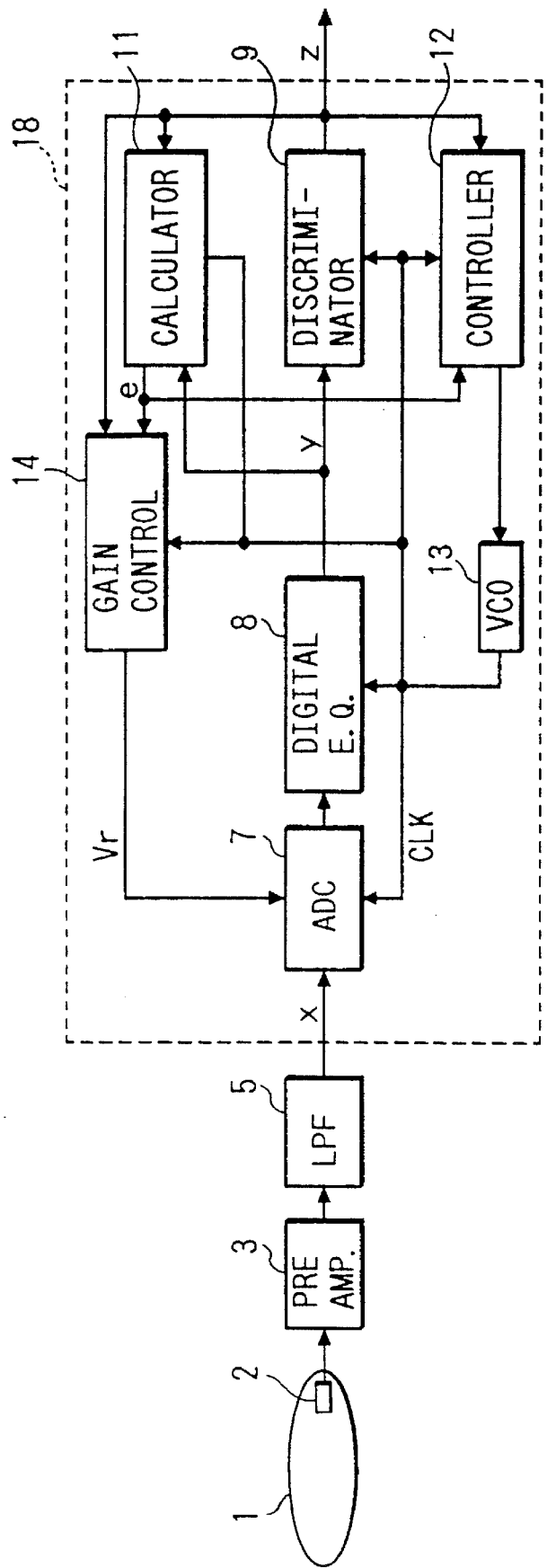
FIG. 1 is a circuit diagram illustrating a signal processing circuit according to an embodiment of the present invention.

FIG. 1 shows a signal processing circuit of the present invention, which comprises a preamplifier 3 which amplifies a signal from a magnetic head 2; an LPF (low-pass filter 5); and a signal processing circuit 18 including an A/D converter 7; a digital equalizer 8; a discriminator 9; a calculator 11 of equalization error; a controller 12 of a voltage-controlled oscillator (VCO); a VCO 13 which forms a system clock (CLK) in response to an output of the VCO controller 12; and a gain-controlled signal generator 14 which controls a reference voltage Vr of the A/D converter 7.

As shown in the embodiment of FIG. 4, a simplified discriminator 15 can be provided which obtains a result of discrimination for each of the bits in addition to the discriminator 9 which can be a Viterbi decoder, for example. The discriminator 9 produces a result z of discrimination that is delayed by a time of at least several bits, in order to use the output of the simplified discriminator 15 for calculating the equalization error or for calculating a variety of control signals.

In the present invention, a compensative equalizer circuit can be added to the digital equalizer to form an automatic equalizer, with the compensative circuit 10 of the equalizer being controlled by using the equalization error e and the result z of discrimination, in order to automatically set the characteristics of the digital equalizer 8. In such an embodiment, the waveform used for the equalization may be determined in advance and the result of discrimination may be input to meet the predetermined waveform in order to find the characteristics of the digital equalizer 8. Alternatively, the characteristics of the digital equalizer 8 that had been found in advance at the time of shipping or at the time of closing the power source circuit may be recorded and may then be set again depending upon the destination of access.

The reproducing circuit unit of the succeeding stage that include the A/D converter 7, and the circuit unit 18 which comprises the calculator 11 of equalization error, the controller 12 of the voltage-controlled escalator (VCO), the VCO 13 and the gain-controlled signal generator 14, can be realized by CMOS circuits in a form that includes some external elements, and can therefore be formed in one chip in an integrated form including a demodulator circuit in the succeeding stage or a modulator circuit in the recording unit, as well as a digital servo circuit for positioning the magnetic head 2 and a communication circuit relative to the data bus. Alternatively, these elements may be formed in an integrated manner to include the LPF 5 of the reproducing circuit by utilizing a BiCMOS process.

The operation of the magnetic read/write circuit of the present invention will now be described with reference to FIG. 1, wherein a signal from the magnetic head 2 is amplified by the preamplifier 3, and undesired bands are removed by the LPF 5. The output of the LPF 5 (analog signal x) is converted into a digital signal through the A/D converter 7 and is input to the digital equalizer 8. The digital equalizer 8 equalizes the waveforms inclusive of the characteristics of the PR waveform processing, and the Viterbi decoder 9 of the succeeding stage discriminates and reproduces the data that had been recorded. At this time, a calculator 11 of equalization error subtracts the result z of discrimination from an equalization output value y, and outputs an equalization error e. The reference voltage Vr of the A/D converter 7 is negative feedback-controlled by a gain-controlled signal generator 14 that operates on the equalization error e and the output z of the discriminator 9, so that the equalization output y assumes a value necessary for the discrimination at the time when an analog signal is digitized. The VCO 13 generates system clocks CLK such that the equalization error e is decreased by the VCO controller 12 that operates on the equalization error e and the result z of discrimination.

The reference voltage Vr for the A/D conversion of the analog signal x by the A/D converter 7 is controlled by the same method as the method of controlling the gain of the AGC circuit, so that the A/D converter 7 exhibits the same effect as the AGC circuit. The difference from the gain control of the AGC circuit is that the reference voltage Vr is controlled such that the center potential thereof is not changed.

When the simplified discriminator 15 (see FIG. 4) is provided to obtain a result of discrimination for each of the bits in addition to the discriminator 9 (such as a Viterbi decoder), the output of the simplified discriminator 15 is sent to the calculator 11 of equalization error, to the gain-controlled signal generator 14 and to the VCO controller 12, thereby to control the A/D converter 7 and the VCO 13 and to accomplish automatic adjustment of amplitude and high-speed follow-up performance by the VCO 13.

When the characteristics of the digital equalizer 8 are to be automatically set, the equalization error e and the result z of discrimination are input to the compensative circuit 10 of equalizer, and the characteristics of the digital equalizer 8 are optimized while repeating the reproducing operation. At this time, the pattern waveform used for correcting the characteristics of the digital equalizer 8 is recorded in advance in a sector or track on the magnetic disk 1, and the result z of discrimination is input in agreement with the predetermined pattern waveform, to thereby compensate the characteristics of the digital equalizer 8 and to cancel the effect of discrimination error. At the time of shipping, furthermore, a pattern waveform for correcting the characteristics is recorded in a given sector or track on the magnetic disk 1, and a constant of the digital equalizer 8 is found and is recorded in a non-volatile memory 21 (see FIG. 7). After the constant is found, the pattern waveform is erased. At the time of reproduction at a user's site, the constant in the non-volatile memory is set again to the digital equalizer 8 depending upon the destination of access, in order to effect suitable equalization for each of the sectors or the tracks. In this case, the compensative circuit 10 of the equalizer may be included in a tester that determines the circuit characteristics at shipping, enabling the circuit of the storage system to be simplified. Furthermore, a pattern waveform for compensating the characteristics is recorded in a portion of the track, a constant of equalization characteristics is found every time when the power source circuit is closed and is stored in the memory, and, at the time of reproduction, the constant in the memory is set again to the digital equalizer 8 depending upon the track to which access will be made, to thereby effect suitable equalization for each of the tracks. In this case, the compensative circuit 10 of the equalizer needs to be operated only at a moment of closing the power source circuit, contributing to decreasing the consumption of electric power at the time of reproducing the recorded data.

The reproducing circuit unit of the succeeding stage that includes the A/D converter 7, and the reproducing circuit unit that comprises the calculator 11 of equalization error, controller 12 of the voltage-controlled oscillator (VCO), the VCO 13 and the gain-controlled signal generating circuit 14, can be realized by using CMOS circuits, and can hence be fabricated in a single chip in an integrated from (see FIG. 10) while further including a demodulator circuit in the succeeding stage or a modulator circuit in the recording unit, as well as a digital servo circuit for positioning the magnetic head 2, and a communication circuit with respect to the data bus. The integrated circuit that is adapted to the magnetic disk unit makes it possible to realize a very small and compact storage system. By using the BiCMOS process, furthermore, the LPF 5 in the reproducing circuit unit can further be included in an integrated form, making it possible to further decrease the size of the apparatus.

Figure 2A:
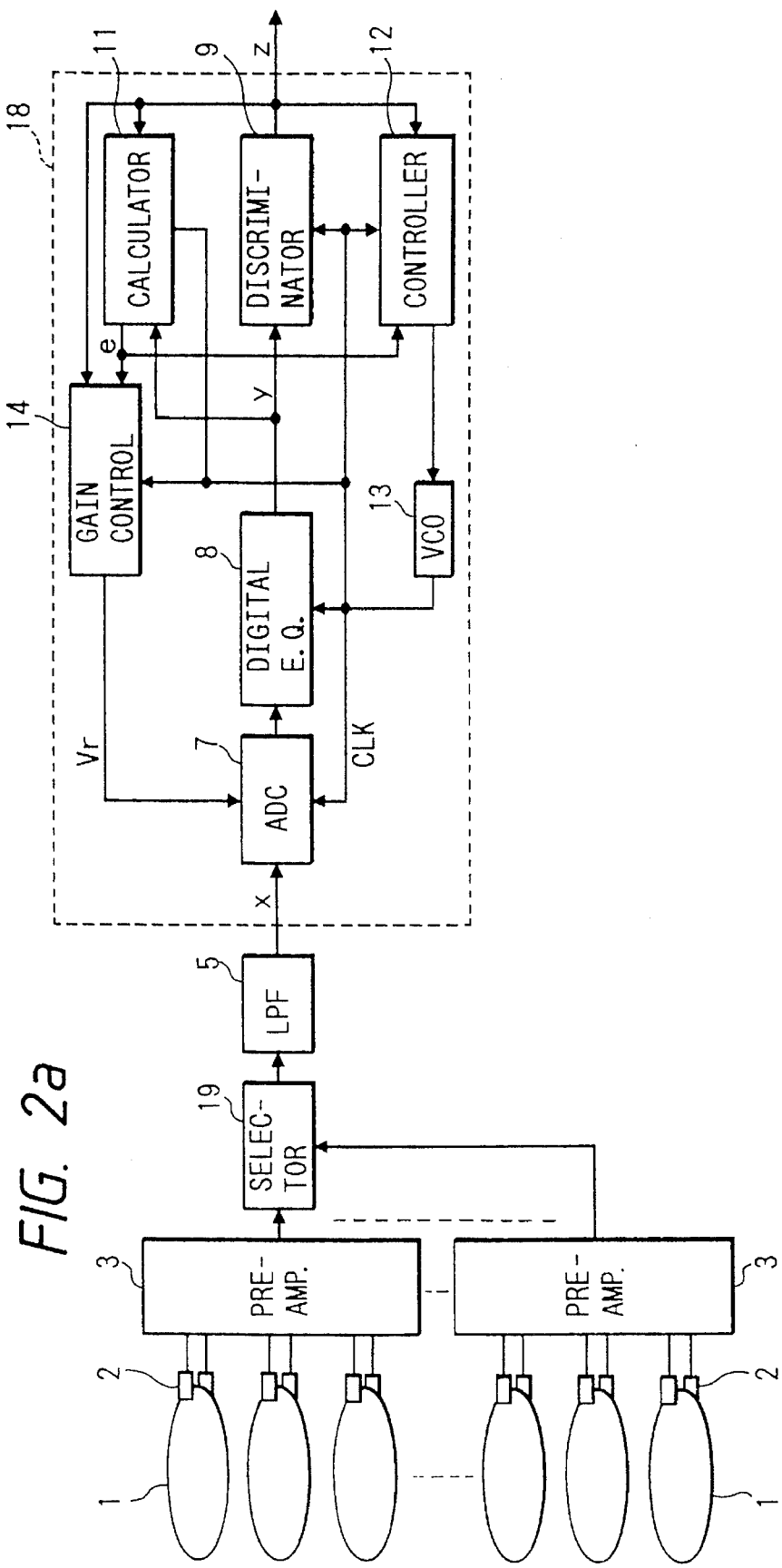
FIG. 2a and 2b is a circuit diagram illustrating a signal processing circuit according to another embodiment of the present invention.
Figure 2B:
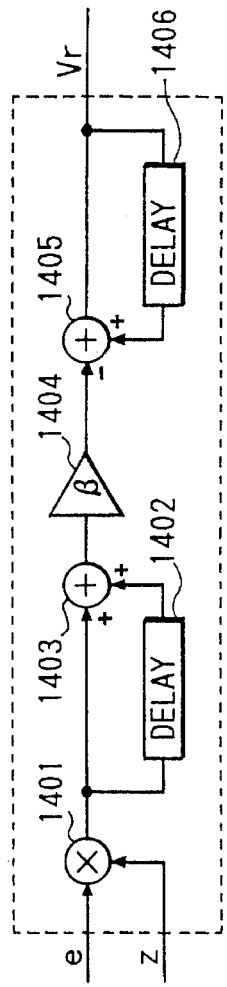

The embodiment of FIG. 2a and 2b comprises one or more disks 1, one or more magnetic heads 2, one or more preamplifiers 3, an LPF 5, a selector 19, and a signal processing circuit 18. This embodiment deals chiefly with a reproducing circuit and does not describe the recording circuit.

When one of the magnetic heads 2 is selected while the magnetic disk 1 is rotating, the signals read through the magnetic head are amplified through the preamplifier 3, and undesired bands are removed from the signal through the LPF 5. The analog output signal x of the LPF 5 is converted into a digital signal through the A/D converter 7. The digital signal is input to the digital equalizer 8 which equalizes the waveform inclusive of characteristics of the PR waveform processing, and a Viterbi decoder 9 in the succeeding stage discriminates and reproduces the recorded data. The decoder 9 can have a similar construction as the decoder shown in U.S. Pat. No. 5,060,088, for example, which is herein incorporated by reference.

At this time, the calculator 11 of the equalization error subtracts the result z of discrimination from the equalization output value y, and outputs the equalization error. the reference voltage Vr of the A/D converter 7 is negative feedback-controlled by the gain-controlled signal generator 14 that operates on the equalization error e and the output z of the discriminator such that the equalization output y assumes a value suited for the discrimination at a moment when the analog signal x is digitized. The VCO 13 generates system clocks CLK, so that the equalization error e is decreased by the VCO controller 12 that operates on the equalization error e and the result x of discrimination. When a plurality of preamplifiers 3 are used, the selector 19 selects any one of them.

For example, the gain controlled signal generator 14 can generate the reference voltage Vr based on the following formulas:

$$Vr(n)=Vr(n-1)-\beta\Delta V(n)$$

$$\Delta V(n)=e(n)z(n)+e(n-1)z(n-1)$$

$(\Delta V(n)$:Revision value, $\beta$:Coefficient)

The detailed circuit of signal generator 14 is, for example, shown in FIG. 2b. The multiplier 1401 multiplies the digitized equalization error e and result z of discrimination. The multiplier 1401 can be constructed, for example, from AND gates. 1403 and 1405 are adders, and 1404 is a coefficient machine. Reference numbers 1402 and 1406 refer to delay lines that provide a delay of one data clock.

Figure 3:
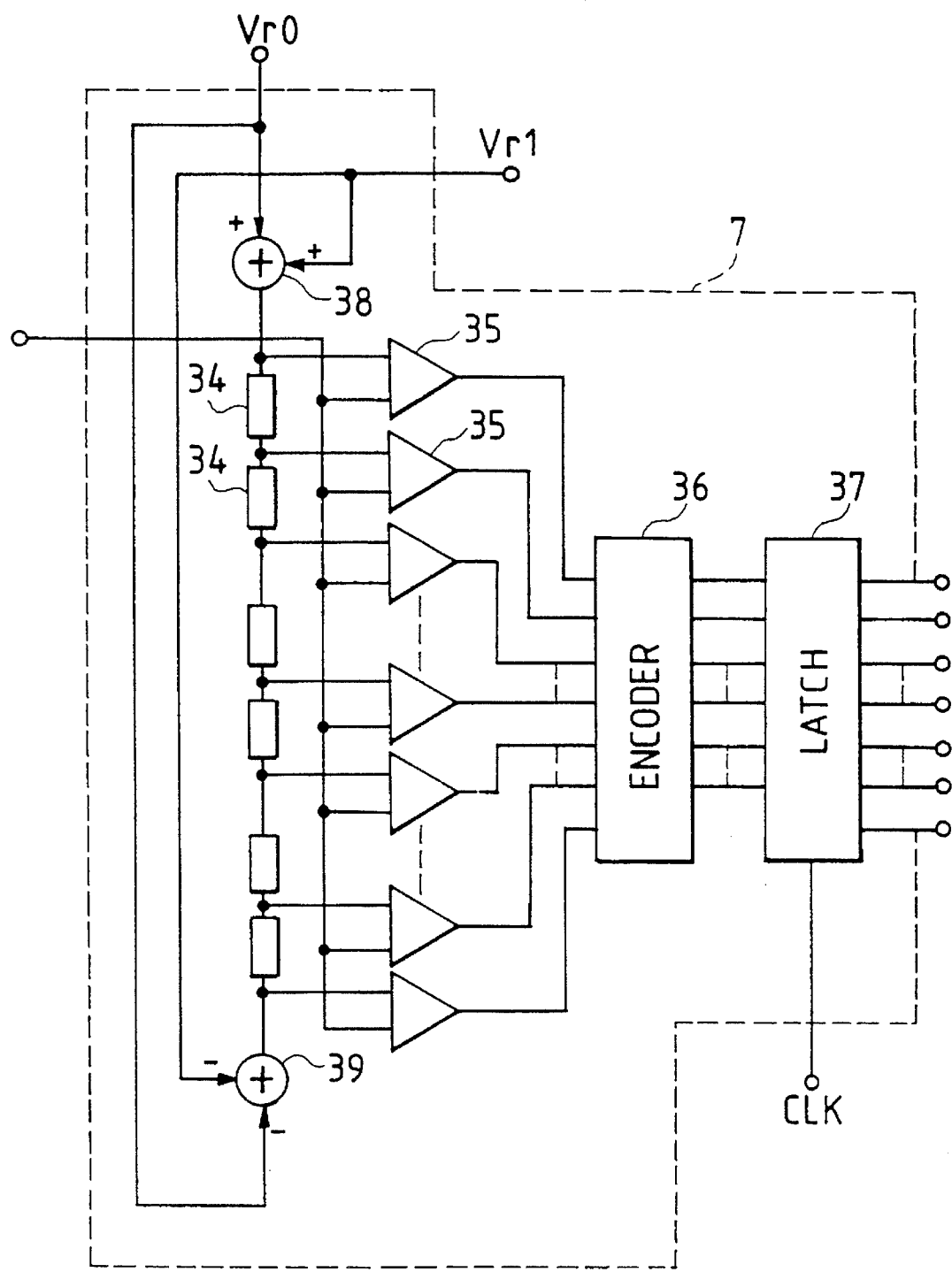
FIG. 3 is a circuit diagram illustrating an A/D converter constructed according to an embodiment of the present invention for use with the embodiments of the signal processing circuit.

As shown in FIG. 3, the A/D converter 7 includes a flash type A/D converter comprising ladder resistors 34, comparators 35, an encoder circuit 36, and a latch 37, and adders 38 and 39 that give a reference voltage to both ends of the group of ladder resistors 34. The reference voltage Vr is given as Vr=Vr0–Vrl. Here, if Vr0 is a fixed potential, Vrl is applied as a positive potential, whereby the voltage increases across the group for ladder resistors 34, and the amplitude of the analog input signal x decreases in the digital output. On the other hand, if Vrl is applied as a negative potential, the voltage decreases across the group of ladder resistors 34, and the amplitude of the analog input signal x increases in the digital output. The values Vr0 and Vrl may be digital values, the adders 38 and 39 may be digital adders, and the outputs of these digital adders 38, 39 may be applied across the ladder resistors 34 using the A/D converter.

In the embodiment of FIG. 2a and 2b, the outputs of the preamplifiers 3 can be switched in a stage preceding the LPF 5, so that the circuits in the succeeding stage inclusive of LPF 5 can be used in common. The embodiment of FIG. 2a and 2b can further be adapted to a storage system which changes the recording density in the radial direction of the magnetic disk 1 by switching a plurality of LPFs 5 having different cut-off frequencies, or by using a variable frequency LPF 5 made of active circuit elements.

The embodiment of FIG. 4 shows a portion of the reproducing circuit unit that is different from that of the embodiment of FIG. 2a and 2b. In addition to the discriminator 9 such as a Viterbi decoder, there is provided in this embodiment a simplified discriminator 10 which obtains a result of discrimination for each of the bits, and the output z' of the simplified discriminator 15 is output to the calculator 11 of equalization error, to the gain-controlled signal generator 14, and to the VCO controller 12, in order to control the A/D converter 7 and the VCO 13. Such a simplified discriminator 15 is known as a "quantizer", and is shown, for example, in U.S. Pat. No. 5,060,088.

According to the embodiment of FIG. 4, the A/D converter 7 and the VCO 13 are controlled by the output z of the simplified discriminator 15 to eliminate the difference in the output time of the result of discrimination caused by the employment of a Viterbi decoder as the discriminator 9, making it possible to accomplish automatic adjustment of amplitude and high-speed follow-up performance by the VCO 13.

FIG. 5 illustrates another embodiment in which only the portion of the reproducing circuit unit that is different from that of the embodiment of FIG. 2a and 2b is shown.

In this embodiment, the characteristics of the digital equalizer 8 are automatically set. That is, a compensative circuit 10 which corrects characteristics of the digital equalizer 8 is provided, and the equalization error e and the result z of discrimination (output of the discriminator) are input to the compensative circuit 10, so that the characteristics of the digital equalizer 8 are optimized while repeating the reproducing operation.

For example, the compensation circuit 10 generates a revision value $\Delta V$vco for controlling the VCO 13 based on the following formula:

$$\Delta V\text{vco }(n) = -e(n)z(n-1) + e(n-1)z(n)$$

This embodiment absorbs variance in the characteristics of the magnetic disk 1 and in the performance of the magnetic head 2.

Figure 6:
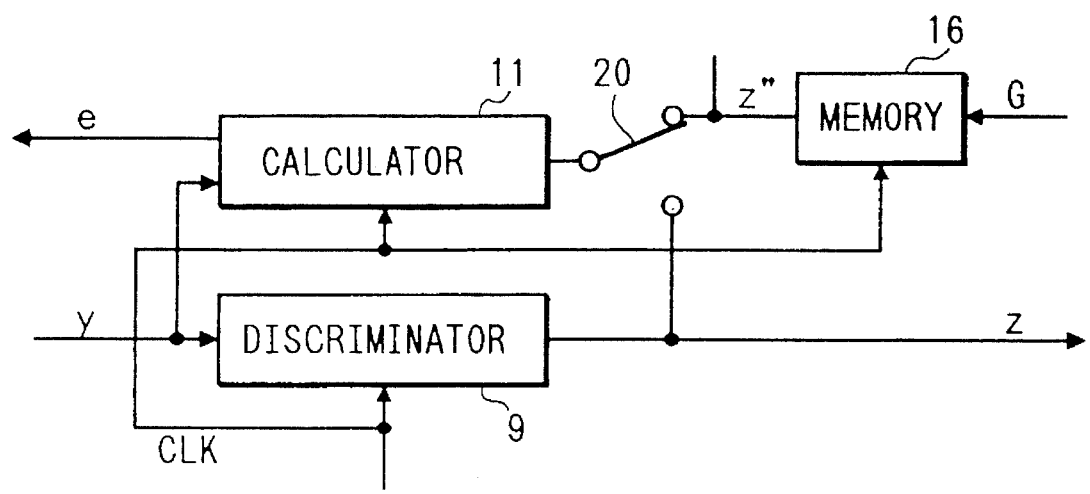
FIG. 6 is a circuit diagram illustrating a portion of a signal processing circuit according to another embodiment of the present invention.

The embodiment of FIG. 6 is concerned with improvement of the reproducing circuit unit of the embodiment of FIG. 5, and as such, only those portions different from those of the embodiment of FIG. 5 will described.

According to the embodiment of FIG. 6, a compensation pattern storage unit 16 and a switch 20 are provided. A pattern waysform used for correcting the characteristics is stored in advance in a sector track on the magnetic disk 1 and is stored in the compensation pattern storage unit 16. The switch 20 is maintained under a condition as shown, and the contents in the storage unit are output to the calculator 11 of equalization error in agreement with the reproduced pattern waveform. The equalization error e is calculated based on the output z. The output is then sent to the compensative circuit 10 of the equalizer to correct the characteristics of the digital equalizer 8. G is a gate signal for controlling the timing of memory 16. The adaptive operation is realized if the switch 20 is flipped to the side of the signal z at a moment when the compensation of characteristics is completed.

Figure 7:
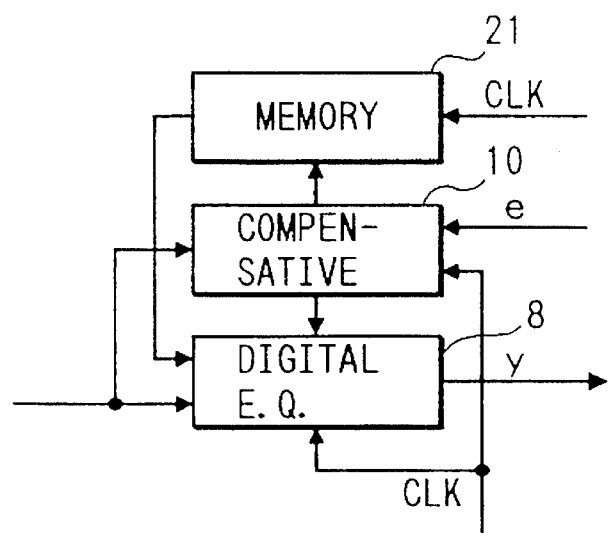
FIG. 7 is a circuit diagram illustrating a portion of a signal processing circuit according to another embodiment of the present invention.

The embodiments of FIG. 7 makes it possible to positively obtain a discrimination output z" that is used for correcting the characteristics, and it brings the characteristics compensation operation into convergence at a high speed and with high performance.

Figure 8:
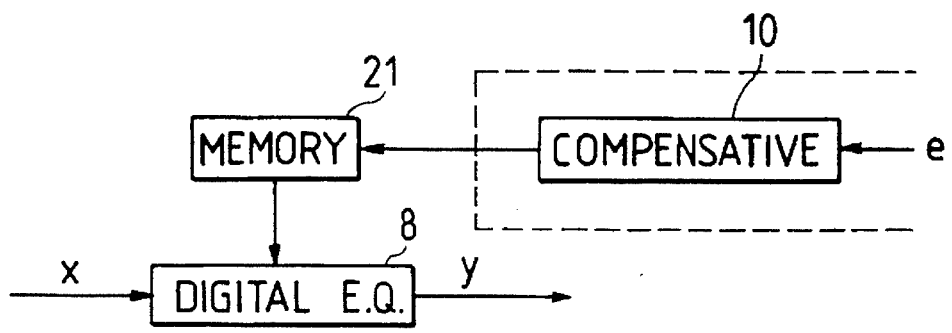
FIG. 8 is a circuit diagram illustrating a portion of a signal processing circuit according to another embodiment of the present invention.

The embodiment of FIGS. 7 and 8 is also related to the improvement of the reproducing circuit unit of the embodiment of FIG. 5, and only those portions different from these of the embodiment of FIG. 6 will be described.

This embodiment is provided with a non-volatile memory 21 on a given sector or a track on the magnetic disk 1 to store a constant that gives characteristics of the digital equalizer 8 at the time of shipping the magnetic disc unit. A pattern waveform for correcting the characteristics is recorded on a given sector on a track on the magnetic disk 1 at the time of shipping, and a constant of the digital equalizer 8 is found via the compensative circuit 10 of equalizer and is stored in the non-volatile memory 21. At the time of a reproducing operation at the user's site, the constant in the non-volatile memory 21 is set again to the digital equalizer 8 depending upon the destination of access, and a suitable equalization is carried out for each of the sectors on the tracks.

According to this embodiment, the compensative circuit 10 of the equalizer needs to be included in a tester that determines the circuit characteristics at shipping. Therefore, the compensative circuit 10 of the equalizer may be omitted from the apparatus as shown in FIG. 8 making it possible to simplify the reproduced signal processing circuit 18. After the constant is found, furthermore, the data for correcting the characteristics may be erased from the magnetic disk 1, offering a wide recording region for the user.

The embodiment of FIGS. 7 and 9 relate to the improvement of the reproducing circuit unit of the embodiment of FIG. 5 so that only those portions different from those of the embodiment of FIG. 5 will be described.

Figure 9:
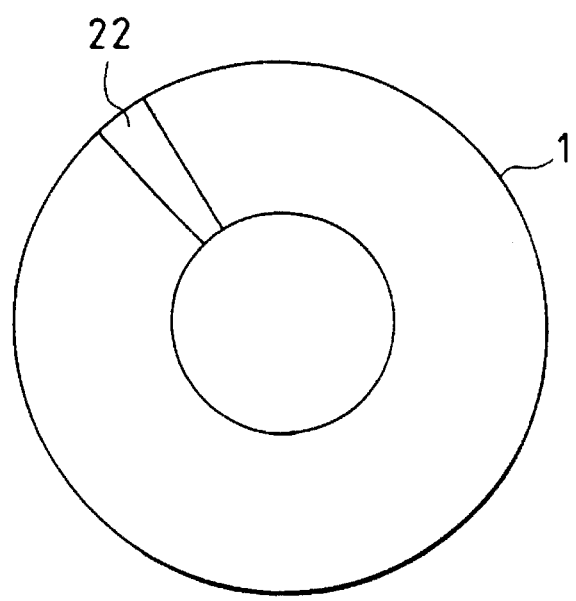
FIG. 9 is a schematic diagram illustrating a state of recording on a magnetic disk according to an embodiment of the present invention.

As shown in FIG. 9, a region 22 is provided on a portion of the track on the magnetic disk 1 to record a pattern waveform that is used for correcting the characteristics, and a constant of equalization characteristics is found every time when the power source circuit is closed and is stored in the non-volatile memory 21. At the time of the reproducing operation, the constant of the non-volatile memory 21 is set again to the digital equalizer 8 depending upon the track to which access will be made.

The circuit constitution is similar to that of the embodiment shown in FIG. 7, but in which the non-volatile memory 21 can be replaced by a volatile memory such as RAM. The pattern for correcting the characteristics may be recorded again every time when the power source circuit is closed.

According to the embodiment of FIGS. 7 and 9, the characteristics are corrected every time the power source circuit is closed, and the circuit is able to cope with a change in the characteristics of the magnetic disk or of the magnetic head caused by the lapse of time. Moreover, the compensative circuit of the equalizer needs to operate only at the moment of correcting the characteristics when the power source circuit is closed. The operation of the compensative circuit of the equalizer can therefore be discontinued during the operation of reproducing the user data, in order to decrease the power consumption of the circuit. Moreover, the RAM that is used as the non-volatile memory 21 makes it easier to carry out the operation at high speeds and to fabricate the circuit in an integrated form.

Figure 10:
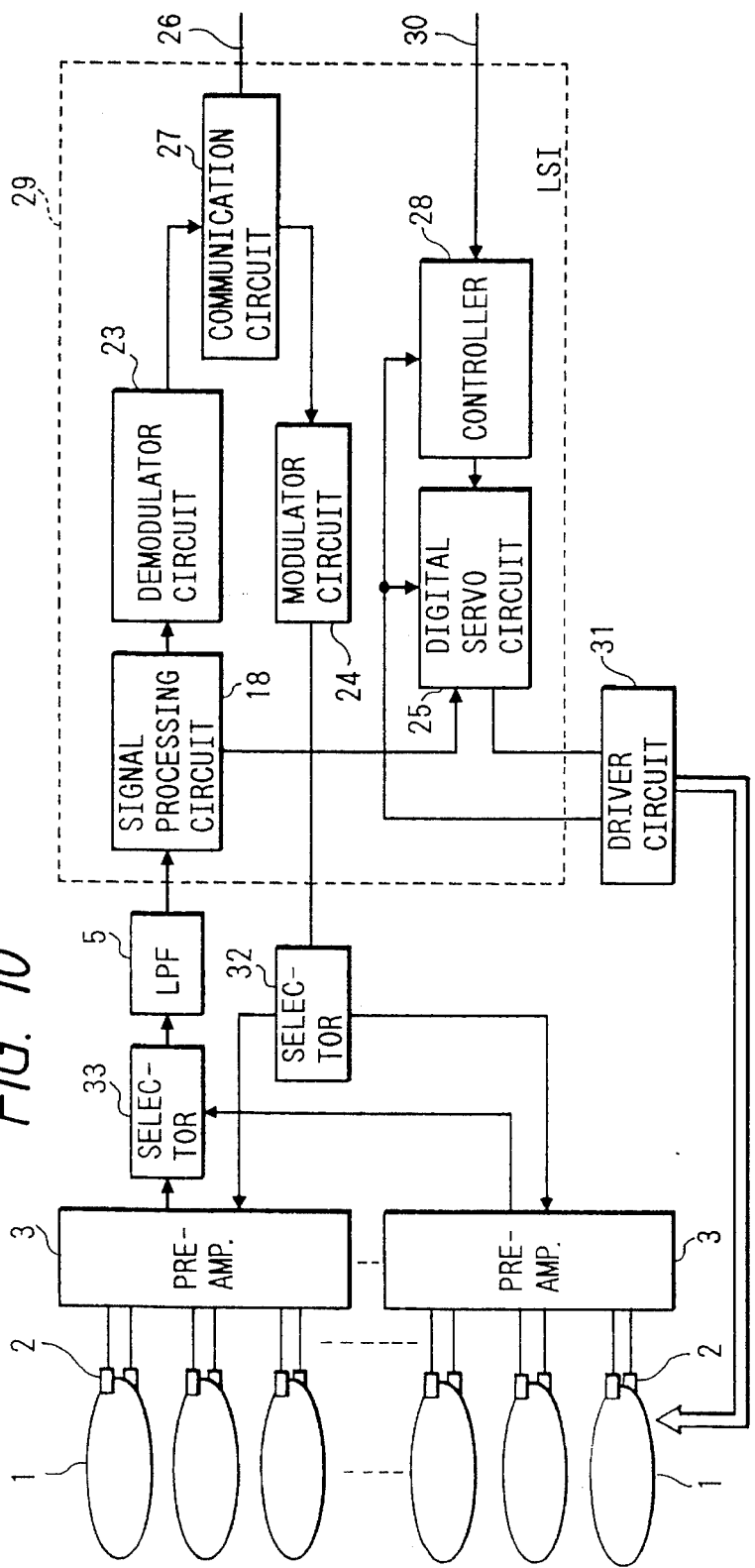
FIG. 10 is a circuit diagram illustrating a portion of the signal processing circuit according to another embodiment of the present invention.
Figure 11:
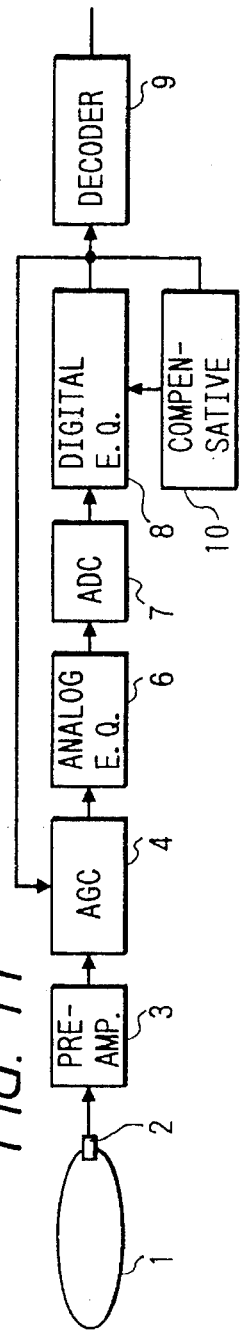
FIG. 11 is a circuit diagram illustrating a conventional signal processing circuit according to the prior art.

In the embodiment of FIG. 10, the reproducing circuit of the succeeding stage including the A/D converter 7 described in the earlier-described embodiments, and the circuit comprising the calculator of equalization error 11, the controller 12 of the voltage-controlled oscillator (VCO), the VCO 13, and the gain-controlled signal generator 12 are realized by CMOS circuits. The demodulator circuit 23 in the succeeding stage, a modulator circuit 24 in the recording unit, a digital servo circuit 25 for positioning the magnetic head 2, a communication circuit 27 with respect to the data bus 26, and a control circuit 28 for controlling the above circuits, are fabricated in the form of an integrated circuit 29, and are mounted on the magnetic disk unit together with the aforementioned circuits.

Reference numeral 30 denotes a control signal for the magnetic disk unit and for the external unit; 31 denotes a driver circuit and status detecting circuit which performs the seeking operation for the magnetic head 2 and the rotating operation for the disk 1; reference numeral 32 denotes a recorded data select circuit; and 33 denotes a reproduced signal select circuit.

The embodiment of FIG. 10 makes it possible to realize a very small magnetic disk unit. The control circuit 28 controls the operation clocks for the circuit blocks, enabling the turn-on rate of the CMOS logic to be lowered. It can therefore be expected to lower the consumption of electric power by the whole signal processing circuit. By-using a BiCMOS process, the LPF 5 in the reproducing circuit unit can also be fabricated in an integrated form within the reproducing circuit unit, so that a smaller magnetic storage system is realized.

With a signal processing system which includes the PR waveform processing by using the signal processing circuit of the present invention as described above in detail, the signal read through the magnetic head 2 is directly digitized by the A/D converter 7 through the low-pass filter (LPF) 5 without using the conventionally employed AGC circuit. Therefore, the analog circuit unit is simplified and is very easily fabricated in a highly integrated form. This makes it possible to realize a signal processing circuit in an integrated form by the CMOS process. Moreover, the integrated signal processing circuit of the present invention makes it possible to obtain a small magnetic storage system having high performance.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A data storage apparatus comprising:

a reproducing head that reproduces information stored on a recording medium and has an output, a preamplifier coupled to the output of the reproducing head that amplifies the output of the reproducing head, a low-pass filter coupled to the preamplifier and having an output, an A/D converter that converts the output of the low-pass filter to a digital signal and has a reference voltage, a discriminator coupled to an output of the A/D converter that discriminates the digital signal, and a circuit, coupled to the discriminator, which negative feedback controls the reference voltage of the A/D converter as a function of the digital signal before discrimination by the discriminator and the digital signal that has been discriminated by the discriminator.

2. A data storage apparatus according to claim 1, further comprising:

a digital equalizer coupled to the output of the A/D converter that equalizes the digital signal from the A/D converter and coupled to the discriminator, a calculator of equalization error coupled to an output of the digital equalizer and an output of the discriminator which subtracts a result of discrimination from the output of said digital equalizer to output an equalization error, and a gain-controlled signal generator coupled in an output of the calculator of the equalization error and the output at the discriminator which is operated by the equalization error and the output of the discriminator, wherein the circuit for negative feedback controls the reference voltage of the A/D converter based on an output of the gain-controlled signal generator.

3. A data storage apparatus according to claim 2, further comprising:

a voltage-controlled oscillator which generates system clocks, and is coupled to the A/D converter, the discriminator, the digital equalizer, the calculator, and the gain controlled signal generator; and a controller of the voltage-controlled oscillator coupled to the output of the calculator of the equalization error and the output of the discriminator, which operates the voltage-controlled oscillator based on the equalization error and on the result of discrimination.

4. A data storage apparatus according to claim 3, wherein said circuit for negative feedback controls the reference voltage of said A/D converter with the center potential thereof kept unchanged.

5. A data storage apparatus according to claim 3, wherein said discriminator obtains the result of discrimination for each of the bits, and further comprising;

a second discriminator coupled to the output of the digital equalizer and an output of the voltage-controlled oscillator, which discriminates the output of said digital equalizer and outputs stored data which is stored on the recording medium.

6. A data storage apparatus according to claim 3, further comprising:

an equalizer compensative circuit coupled to the output of the discriminator, and the output of the calculator, which inputs the equalization error and the result of discrimination and corrects the characteristics of the digital equalizer while repeating the operation for processing reproduced signals.

7. A data storage apparatus according to claim 6, further comprising:

a memory which stores correcting data reproduced from the storage medium for correcting the characteristics of the equalizer, and a switch coupled to an output of the memory and the output of the discriminator which inputs the correcting data to the calculator instead of the result of discrimination.

8. A data storage apparatus according to claim 6, further comprising:

a memory, coupled to this digital equalizer, which stores a controlling signal and outputs the controlling signal to the digital equalizer.

9. Data processing method comprising:

introducing an analog signal, removing signals of undesired frequency bands from the analog signal, converting the analog signal to a digital signal based on a reference voltage signal, discriminating said digital signal to produce a discriminated digital signal representing reproduced digital data, comparing the non-discriminated digital signal with the discriminated digital signal, generating a gain-controlled signal based on the result of the comparing, and controlling the reference voltage signal based on the gain-controlled signal.

10. Data processing method according to claim 9, further comprising:

equalizing said digital signal to produce an equalized digital signal, calculating equalization error based on the equalized digital signal and the discriminated digital signal, and generating the gain-controlled signal which is operated by the equalization error and the reproduced digital data.

11. Data processing method according to claim 10, further comprising:

generating a system clock by a voltage-controlled oscillator, and controlling the voltage-controlled oscillator based on the equalization error and the reproduced digital data.

12. Data processing method according to claim 9, wherein the analog signal is reproduced from a magnetic recording medium by magnetic head, and further comprising, equalizing said digital signal, recording correction data that is used for correcting characteristics of the equalizing on the recording medium, reproducing the correction date, storing the correction data, and calculating the equalization error based on the stored correction data and the digital signal, in order to correct the characteristics of the equalization.

13. Data processing method according to claim 9, wherein the analog signal is reproduced form a magnetic recording medium by magnetic head, and further comprising:

equalizing said digital signal, recording data for correcting characteristics of the equalizing, reproducing the data for correcting the characteristics of the equalizing, generating an equalization control signal based on the data for correcting the characteristics of the equalizing, storing the equalization control signal, and controlling the equalizing based on the equalization control signal.

14. A signal processing system comprising:

means for introducing an analog signal, means for amplifying coupled to the means for introducing, means for converting the analog signal to a digital signal coupled to the means for amplifying, means for discriminating the digital signal coupled to the means for converting in order to reproduce digital data, means for evaluating the digital signal from the means for converting, which is coupled to the means for converting, means for generating a controlling signal based on the result of the evaluating, which is coupled to the means for evaluating, means for controlling the means for converting based on the controlling signal such that the digital signal from the means for converting assumes a predetermined value necessary for the discriminating, and means for equalizing said digital signal coupled to the means for converting, wherein the means for evaluating has means for calculating equalization error coupled with the means for discriminating and the means for equalizing, which subtracts an output of the means for discrimination from an output of the means for equalizing, and outputs an equalization error, wherein the means for generating a controlling signal is operated by the equalization error and the output of the means for discriminating.

15. A signal processing system according to claim 14, further comprising:

means for generating system clocks, and means for controlling the means for generating system clocks based on the equalization error and output of the means for discriminating, coupled to the means for calculating and the means for discriminating.

16. A signal processing system comprising:

means for introducing an analog signal, means for amplifying coupled to the means for introducing, means for converting the analog signal to a digital signal coupled to the means for amplifying, means for discriminating the digital signal coupled to the means for converting in order to reproduce digital data, means for evaluating the digital signal from the means for converting, which is coupled to the means for converting, means for generating a controlling signal based on the result of the evaluating, which is coupled to the means for evaluating, means for controlling the means for converting based on the controlling signal such that the digital signal from the means for converting assumes a predetermined value necessary for the discriminating, and wherein the means for converting has a series of ladder resistances and a means for applying a reference voltage between both ends of the series of ladder resistances, wherein the means for controlling the means for converting controls the reference voltage such that the amplitude of the output for the means for controlling is controlled.

* * * * *